(12) United States Patent
Lakdawala et al.

(10) Patent No.: US 7,760,121 B2
(45) Date of Patent: Jul. 20, 2010

(54) DUAL DATA WEIGHTED AVERAGE DYNAMIC ELEMENT MATCHING IN ANALOG-TO-DIGITAL CONVERTERS

(75) Inventors: Hasnain Lakdawala, Beaverton, OR (US); Pukar Malla, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/203,679

(22) Filed: Sep. 3, 2008

(65) Prior Publication Data
US 2010/0052960 A1    Mar. 4, 2010

(51) Int. Cl.
*H03M 1/80* (2006.01)
(52) U.S. Cl. ........................ 341/153; 341/144
(58) Field of Classification Search .............. 341/143, 341/144, 155, 120, 118, 153
See application file for complete search history.

(56) References Cited

U.S. PATENT DOCUMENTS

| 6,462,685 | B1 * | 10/2002 | Korkala ............... 341/131 |
| 7,439,889 | B2 * | 10/2008 | Fujimoto .............. 341/143 |
| 7,489,263 | B1 * | 2/2009  | Drakshapalli et al. ....... 341/155 |

OTHER PUBLICATIONS

Malla, Pukar et al., "A 28mW Spectrum-Sensing Reconfigurable 20MHz 72dB-SNR 70dB-SNDR DT ΣΔ ASC for 802.11 n/WiMAX Receivers", *IEEE International Solid-State Circuit Conference*, (2008), 3 pages.
Baird, Rex T., et al., "Linearity Enhancement of Multibit ΔΣ A/D and D/A Converters Using Data Weighted Averaging", *IEE Transactions on Circuits and Systems—II: Analog and Digital Signal Processing*, vol. 42, No. 12, (Dec. 1995), 10 pages.
Malla, Pukar et al., "A 28mW Spectrum-Sensing Reconfigurable 20MHz 72db-SNR 70dB-SNDR DT ΔΣ ADC for 802.11 n/WiMAX Receiver", 28 pages, 1995.

* cited by examiner

*Primary Examiner*—Brian Young
(74) *Attorney, Agent, or Firm*—Garrett IP, LLC

(57) ABSTRACT

Methods and systems to provide dynamic element matching (DEM) in multi-phase sample systems include multiple uncorrelated, dual data weighted averaging, dynamic element matching (DDWA DEM). DDWA DEM may be implemented in a multiple-phase sample system in which sample paths and feedback paths share capacitances. Compensation feedback is apportioned amongst corresponding banks of capacitive sample circuits to utilize the capacitive sample circuits within each bank substantially equally over multiple sample cycles. The apportioning is substantially un-correlated between banks, which may reduce in-band quantization noise folding. DDWA DEM may be implemented within a digital-to-analog converter (DAC), in a delta-sigma modulator.

20 Claims, 5 Drawing Sheets

DUAL DATA WEIGHTED AVERAGE DYNAMIC ELEMENT MATCHING IN ANALOG-TO-DIGITAL CONVERTERS

BACKGROUND

In a double sample delta-sigma modulator, an integrator output includes a modulated product of a sampled input signal at half the sampling frequency. The modulated product at half the sampling frequency folds the out of band quantization noise of the modulator in-band.

A double sample delta-sigma modulator may include a feedback path having a digital-to-analog converter (DAC), to provide compensation feedback to the sample circuits. Quantization noise in a delta-sigma modulator peaks at half the sampling frequency.

If the DAC output and the input signal samples are applied to a common capacitor, in-band quantization noise folding may degrade signal-to-quantization noise ratio. In addition, deviation from virtual ground at an operation amplifier within the integrator may degrade signal-to-noise ratio.

A double sample delta-sigma modulator may include separate capacitors to receive outputs of the DAC. The separate capacitors, however, increase settling requirements of the operational amplifier.

A double sample delta-sigma modulator may be configured with a "zero" at half the sampling frequency. This, however, may decrease a maximum stable input range, and thus a signal-to-noise ratio of the delta-sigma modulator.

A data weighted averaging (DWA), dynamic element matching (DEM) technique has be utilized in multi-bit delta-sigma data converters to shape distortion spectra from digital-to-analog (DAC) linearity errors, to improve dynamic range.

BRIEF DESCRIPTION OF THE DRAWINGS/FIGURES

Figure 1:
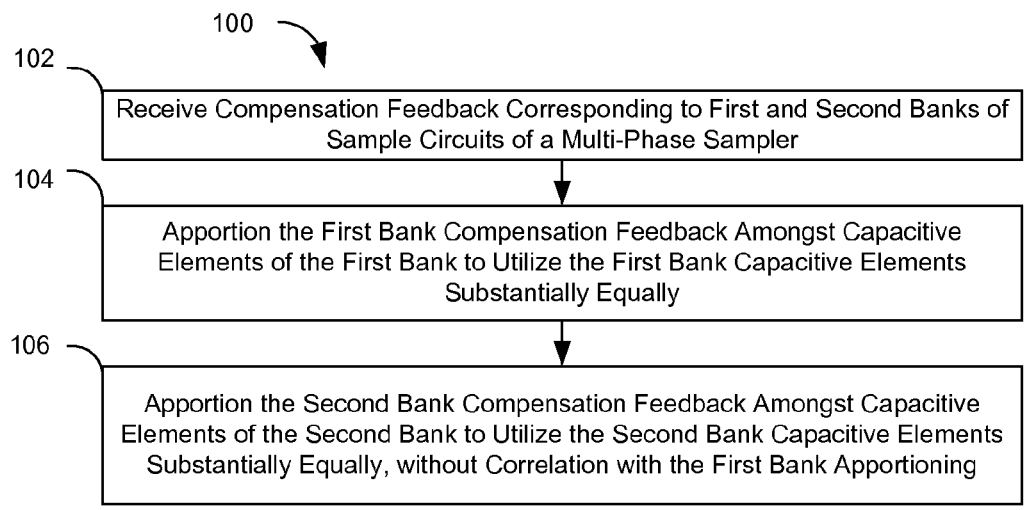
FIG. 1 is a process flowchart of an exemplary method of dynamically matching elements in multiple-phase sample system.

In the drawings, the leftmost digit(s) of a reference number identifies the drawing in which the reference number first appears.

DETAILED DESCRIPTION

Disclosed herein are methods and systems to implement dual data weighted average dynamic element matching (DDWA DEM), in digital-to-analog converters, including multiple-phase sample systems. A multiple-phase sample system may include first and second sample banks configured to sample an input signal substantially out of phase with respect to one another, and each sample bank may include a plurality of capacitive sampling elements to receive signal samples and compensation feedback.

FIG. 1 is a process flowchart of an exemplary method 100 of dual data weighted average dynamic element matching.

At 102, compensation feedback is received corresponding to first and second sample banks.

At 104, the compensation feedback corresponding to the first bank is apportioned amongst the first bank capacitive sample circuits to utilize the first bank capacitive sample circuits substantially equally over multiple sample cycles.

At 106, the compensation feedback corresponding to the second bank is apportioned amongst the second bank capacitive sample circuits to utilize the second bank capacitive sample circuits substantially equally over multiple sample cycles.

The apportioning of 104 is substantially un-correlated with the apportioning of 106. This may reduce in-band quantization noise.

Figure 2:
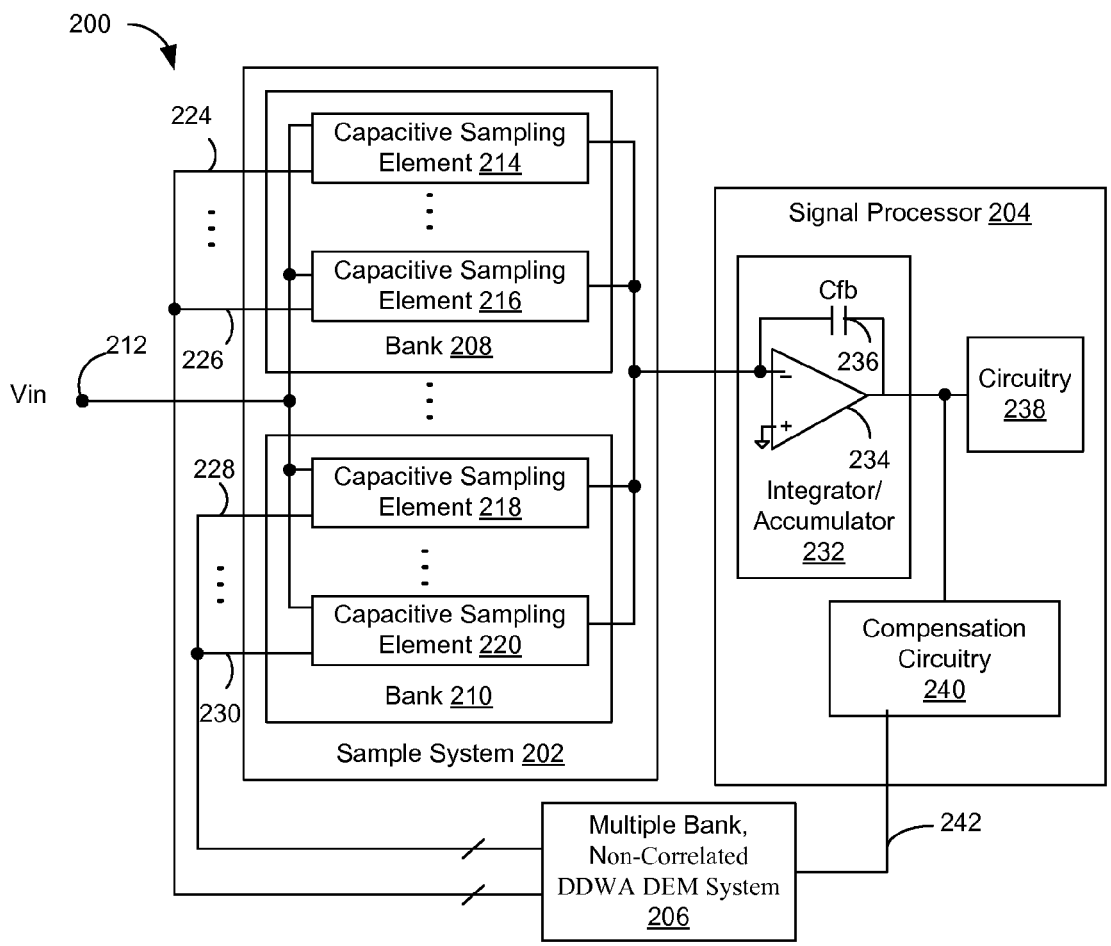
FIG. 2 is a block diagram of an exemplary system 200, including a multiple-phase sample system and a dual data weighted average (DDWA), dynamic element matching system (DEM).

FIG. 2 is a block diagram of an exemplary system 200, with which method 100 may be implemented. Method 100 is not, however, limited to exemplary system 200.

System 200 includes a multiple-phase sample system 202, a signal processor 204, and a multiple-bank, non-correlated, dual data weighted averaging (DDWA) dynamic element matching (DEM) system 206. System 200 may include a delta-sigma modulator.

System 202 includes a plurality of j sample circuits, or banks 208 through 210, coupled to an input node 212, where j is a positive integer greater than one. Banks 208 through 210 may be controlled to sample an input signal $V_{in}$ at input node 212, out of phase with respect to one another. For example, where j is two (2), banks 208 and 210 may be controlled to sample input signal $V_{in}$ substantially 180 degrees out of phase with one another.

Banks 208 through 210 each include a plurality of N capacitive sampling elements, 214 through 216, and 218 through 220, respectively, where N is a positive integer greater than one. Elements 214 through 216, and elements 218 through 220, may include substantially similar circuits, which may include switched-capacitor sample circuits. Exemplary implementations and operation of elements 214 through 216, and elements 218 through 220, are disclosed below with respect to FIGS. 4 through 6.

Signal processor 204 may include one or more of analog and digital circuits to process signal samples from banks 208 through 210. In the example of FIG. 2, signal processor 204 includes integrator or accumulator circuitry 232, illustrated here as including an operational amplifier (OpAmp) 234 and a capacitor Cfb 236, operation of which is well known. Signal processor 204 may include additional circuitry 238.

Signal processor 204 includes compensation circuitry 240 to generate compensation feedback to be applied to banks 208 through 210 over a feedback path 242. Compensation circuitry 240 may be configured to generate compensation feedback to affect one or more characteristics of system 200.

Compensation circuitry 240 may be configured to generate compensation feedback to remove charge from capacitor Cfb 236. Compensation circuitry 240 may be configured to generate the compensation feedback to substantially cancel charge transferred from input node 212 to Cfb 236 over multiple prior sample cycles.

Compensation circuitry 240 may be configured to generate corresponding feedback compensation for each of banks 208 through 210, and may be configured to provide the compensation feedback following sample operations performed by each of the banks.

Compensation circuitry 240 may be configured to provide feedback values as digital words, indicative of a number of elements 214 through 216, and 218 through 220, to be enabled and/or utilized in one or more subsequent sample operations. For example, a feedback word may indicate a number of feedback paths 224 through 230 to be activated, or set high or low.

System 206 is configured to provide compensation feedback to elements 214 through 216 over feedback paths or lines 224 through 226, respectively, and to elements 218 through 220 over feedback lines 228 through 230, respectively. System 206 may include, or may be implemented within a digital-to-analog converter (DAC), an example of which is disclosed below with reference to FIG. 3.

System 206 is configured to apportion compensation feedback amongst elements 214 through 216 so as to utilize elements 214 through 216 substantially equally over multiple sample cycles. Similarly, system 206 is configured to apportion compensation feedback amongst elements 218 through 220 SO as to utilize elements 218 through 220 substantially equally over multiple sample cycles. The apportioning amongst elements 214 through 216 is substantially un-correlated with the apportioning elements 218 through 220, which may reduce in-band quantization noise folding.

System 206 may be configured to utilize elements 214 through 216 and elements 218 through 220, at a maximum possible rate.

System 206 may be configured to utilize elements 214 through 216 sequentially, in a wrap-around fashion, and to maintain a pointer to identify a starting one of elements 214 through 216 to be used in a subsequent sample cycle. Similarly, system 206 may be configured to utilize elements 218 through 220 sequentially, in a wrap-around fashion, and to maintain a pointer to identify a starting one of elements 218 through 220 to be used in a subsequent sample cycle. The pointers may be substantially non-correlated with respect to one another.

For example, where an input signal is sampled at two phases, an odd pointer corresponding to odd phases, and an even pointer corresponding to even phases, may be maintained to control activation of feedback lines 224 through 226, and 228 through 230, respectively.

The odd pointer, denoted below as $Y_{DEM}(2n+1)$, may be defined as a sum of feedback lines activated during previous odd phases, and may be represented as:

$$Y_{DEM}(2n+1) = MOD\left[\left(\sum_{-\infty}^{k=2n-1} X_{DAC}(2k-1)\right), N_{DAC}\right],$$

where $X_{DAC}(2k-1)$ represents previous odd inputs to system 206, and $N_{DAC}$ is the number of output lines 224 though 226, corresponding to elements 214 through 216.

The odd pointer may be used to identify a starting one of feedback lines 224 through 226 to be activated in a current or subsequent odd sample cycle.

Similarly the even pointer, denoted below as $Y_{DEM}(2n)$, may be defined as a sum of feedback lines activated during previous even phases, and may be represented as:

$$Y_{DEM}(2n) = MOD\left[\left(\sum_{-\infty}^{k=2n-2} X_{DAC}(2k-2)\right), N_{DAC}\right],$$

where $X_{DAC}(2k-2)$ represents previous even inputs to system 206, and $N_{DAC}$ is the number of output lines 228 through 230, corresponding to elements 218-220.

The even pointer may be used to identify a starting one of feedback lines 128 through 130 to be activated in a current or subsequent even sample cycle.

Active ones of lines 124 through 126, and 128 through 128, may be represented as:

MOD(Ydem,Ndac)
MOD(Ydem+1,Ndac)
... MOD(Ydem+Xdac−1,Ndac)

Figure 3:
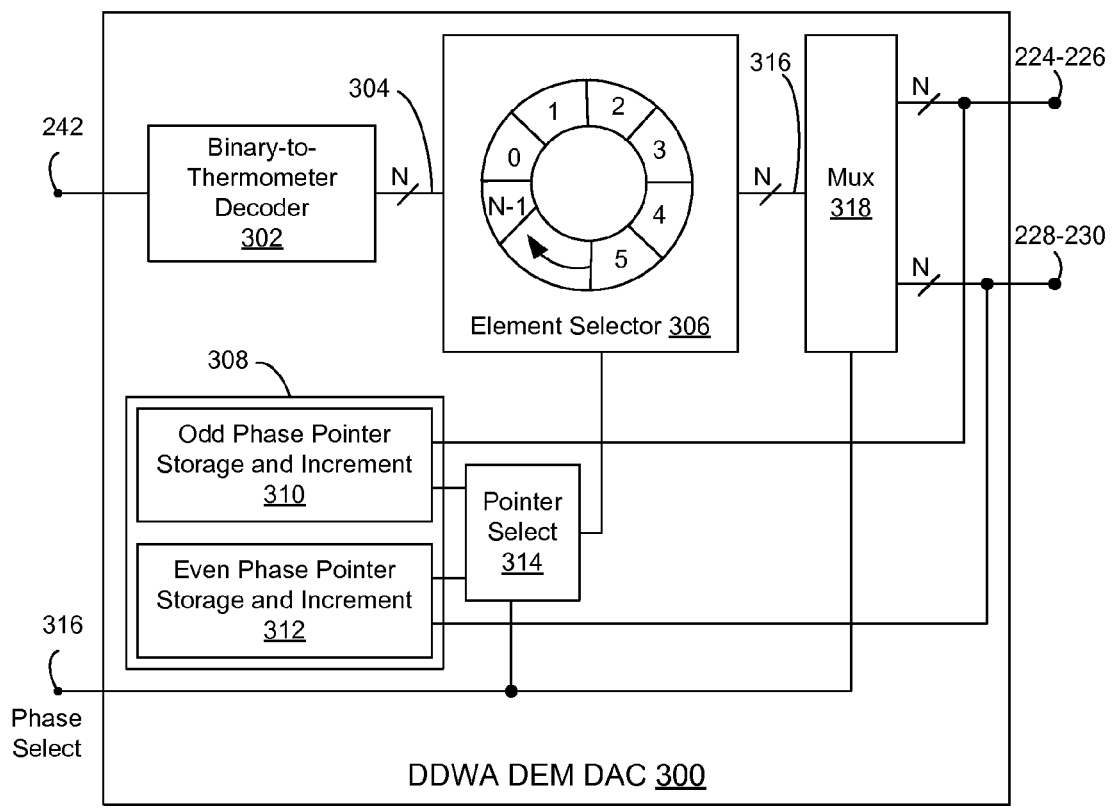
FIG. 3 is a block diagram of an exemplary DDWA DEM), digital-to-analog converter (DAC).

System 206 may be implemented as illustrated in FIG. 3. FIG. 3 is a block diagram of an exemplary DDWA DEM digital-to-analog converter (DAC) 300, to receive binary or digital values over feedback path 242, and to convert the values to odd phase N-bit outputs 224-226, and even phase N-bit outputs 228-230.

DAC 300 may include a binary-to-thermometer decoder 302 to decode values received from feedback path 242 to an N-bit thermometer code. The N-bit thermometer code is provided to an element selector 306 over a path 304. Element selector 306 may include a barrel-shifter.

DAC 300 includes a pointer storage and increment system 308, which may include first and second pointer storage and increment systems 310 and 312, respectively, to hold and increment corresponding N-bit odd phase and even phase pointers. Pointer storage and increment system 308 may include flip-flops.

A pointer select circuit 314, which may include a multiplexer, is coupled between pointer storage and increment system 308 and element selector 306, to provide either of the even and odd pointers to element selector 306, under control of a phase select signal at a phase select node 316.

Element selector 306 is configured to shift the N-bit thermometer code in accordance with the first and second pointers, during corresponding odd and even phases, and to output a shifted N-bit thermometer code on a path 316.

DAC 300 may include an output multiplexer 318 to selectively output the shifted N-bit thermometer code from path 316 to either of feedback lines 224-226 and feedback lines 228-230.

Pointer storage and increment system 308 may receive indications of active bits from one or more of feedback path 242, path 304, path 316, and feedback lines 224-230, and may be configured to increment corresponding odd and even pointers accordingly.

Exemplary operation of DAC 306 is described with respect to Table 1 below, for N=7, and where the compensation feedback received from path 242 includes three bit binary words. DAC 306 is not, however, limited to the examples below. Other embodiments may include, for example and without limitation, N=15, and four bit binary compensation feedback words.

Referring to Table 1, at an odd phase of sample period 1, decoder 302 receives a binary word of (011), and converts the binary word to a corresponding thermometer code of three active bits (1110000). Element selector 306 receives an odd phase pointer having a value of one, and outputs the three active bits beginning with bit one, as (0111000). The odd phase pointer is then incremented by the three active bits, to a value of four.

At an even phase of sample period 1, decoder 302 receives a binary word of (100), and converts the binary word to a corresponding thermometer code of four active bits (1111000). Element selector 306 receives an even phase pointer having a value of three, and outputs the four active bits beginning with bit three, as (0001111). The even phase pointer is then incremented by the four active bits, which wraps around to a value of zero.

At an odd phase of sample period 2, decoder 302 receives a binary word of (100), and decodes the binary word to a corresponding thermometer code of four active bits (1111000). Element selector 306 receives the odd phase pointer having a value of four, and outputs the four active bits beginning with bit four and wrapping around to bit zero, as (1000111). The odd phase pointer is then incremented by the four active bits, which wraps around to a value of one.

At an even phase of sample period 2, decoder 302 receives a binary word of (110), and converts the binary word to a corresponding thermometer code of six active bits (1111110). Element selector 306 receives the even phase pointer having a value of zero, and outputs the four active bits beginning with bit zero, as (1111110). The even phase pointer is then incremented by the six active bits, to a value of six.

Table 1 includes additional exemplary values for time periods 3, 4, and 5.

Bank 210 elements 218 through 220 each include a capacitive element 412 and switches 414, 416, 418, and 420.

In bank 208, switches 404 and 410 may be controlled by a signal p1, and switches 406 and 408 may be controlled by a signal p2. In bank 210, switches 414 and 420 may be controlled by signal p2, and switches 416 and 418 may be controlled by signal p1.

Signals p1 and p2 may be out of phase with respect to one another. Where system 200 includes two banks 208 and 210, signals p1 and p2 may be substantially 180 degrees out of phase with respect to one another. Signals p1 and p2 may have substantially non-overlapping edges with respect to one another.

Figure 4:
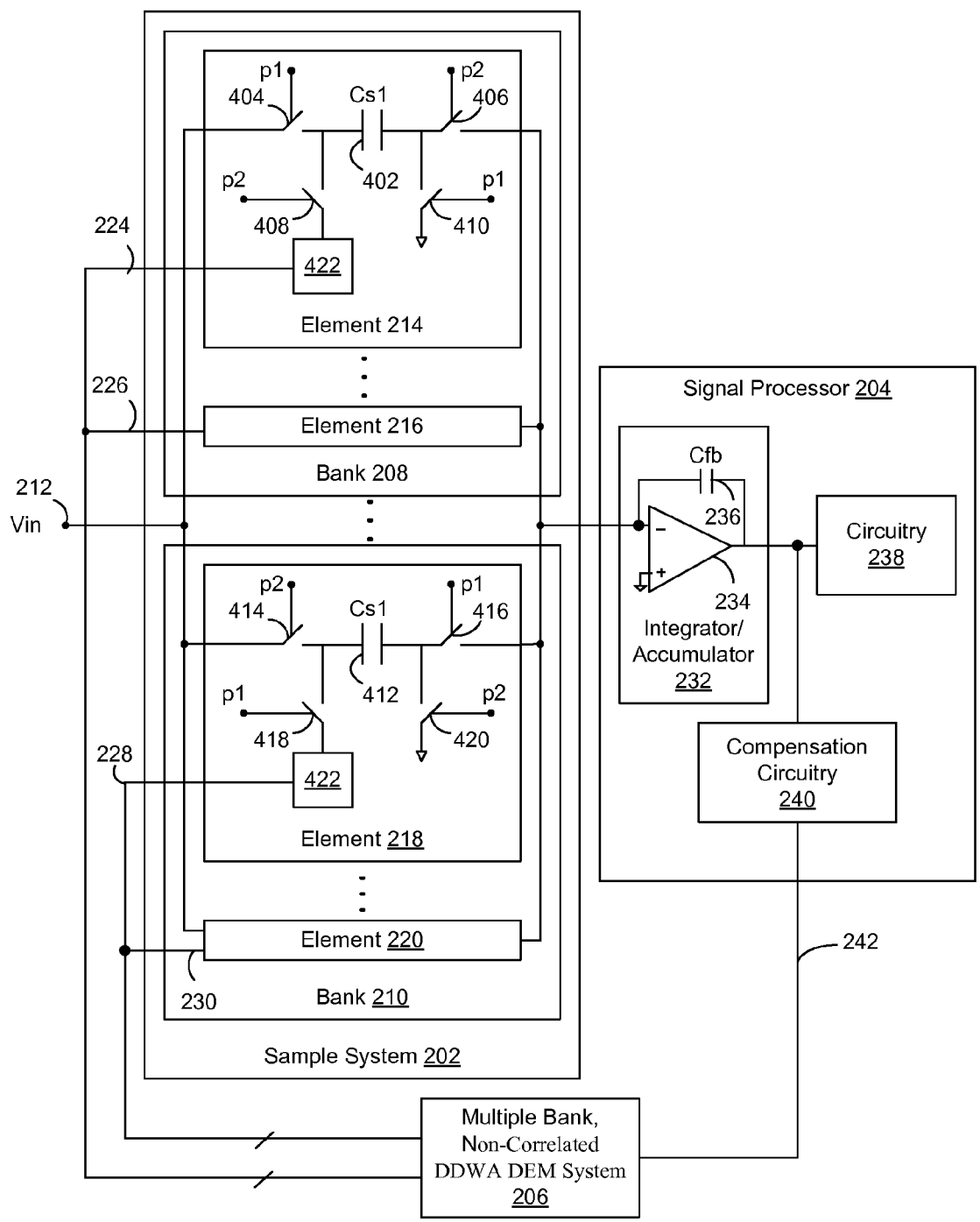
FIG. 4 is a block diagram of an exemplary implementation of system 200, including switched-capacitor sampling circuits.
Figure 5:
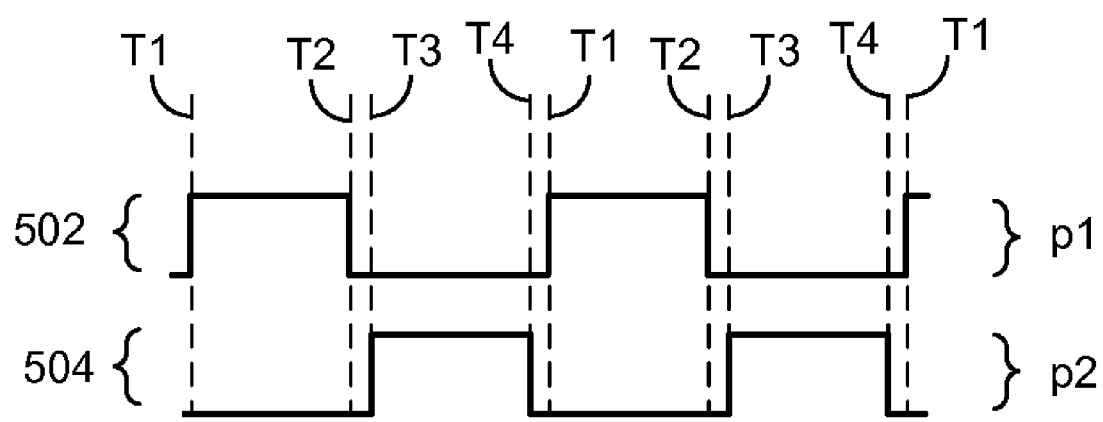
FIG. 5 is an exemplary timing diagram.

FIG. 5 is an exemplary timing diagram wherein signals p1 and p2 are illustrated as signals 502 and 504, respectively. Exemplary operation of system 200, as illustrated in FIG. 4, is described below with respect to times T1 through T4 in FIG. 5. In the example below, elements 214 through 216 are controlled to sample at time T1 and to discharge at time T3. Correspondingly, elements 218 through 220 are controlled to sample at time T3 and to discharge at time T1. Operation of the switched capacitor sample circuits in FIG. 4 is not, however, limited to the example timing diagram of FIG. 5.

TABLE 1

| Sample | | DAC | Therm. | | Element Selector 306 Outputs 316 (for N = 7) | | | | | | |
|---|---|---|---|---|---|---|---|---|---|---|---|
| Period | Phase | Input 242 | Code 304 | Pointer Values | 0 | 1 | 2 | 3 | 4 | 5 | 6 |
| 1 | Odd  | 011 | 1110000 | Odd: 1  | 0 | 1 | 1 | 1 | 0 | 0 | 0 |
| 1 | Even | 100 | 1111000 | Even: 3 | 0 | 0 | 0 | 1 | 1 | 1 | 1 |
| 2 | Odd  | 100 | 1111000 | Odd: 4  | 1 | 0 | 0 | 0 | 1 | 1 | 1 |
| 2 | Even | 110 | 1111110 | Even: 0 | 1 | 1 | 1 | 1 | 1 | 1 | 0 |
| 3 | Odd  | 010 | 1100000 | Odd: 1  | 0 | 1 | 1 | 0 | 0 | 0 | 0 |
| 3 | Even | 011 | 1110000 | Even: 6 | 1 | 1 | 0 | 0 | 0 | 0 | 1 |
| 4 | Odd  | 111 | 1111111 | Odd: 3  | 1 | 1 | 1 | 1 | 1 | 1 | 1 |
| 4 | Even | 001 | 1000000 | Even: 2 | 0 | 0 | 1 | 0 | 0 | 0 | 0 |
| 5 | Odd  | 011 | 1110000 | Odd: 3  | 0 | 0 | 0 | 1 | 1 | 1 | 0 |
| 5 | Even | 110 | 1111100 | Even: 3 | 1 | 0 | 0 | 1 | 1 | 1 | 1 |

As disclosed herein, element selection, or averaging is controlled by the data sequence within the compensation feedback, and is thus referred to herein as dual data weighted averaging (DDWA) dynamic element matching (DEM).

Where a delta-sigma modulator includes a multi-phase sampler configured with sample paths and feedback paths having shared capacitors, DDWA DEM based-digital-to-analog conversion may reduce quantization noise from folding in-band.

One or more of method 100, DDWA DEM system 206, and DAC 300, may be implemented in a multiple-phase sigma-delta analog-to-digital converter system to utilize a multiple-phase sample system substantially one hundred percent of the time, which may reduce power requirements of an operational amplifier, such as OpAmp 234 in FIG. 2.

DDWA DEM, as disclosed herein, may be implemented in digital-to-analog converters, including stand-alone DACs having multiple time-interleaved banks, which may be utilized to provide a greater sampling rate.

DDWA DEM, as disclosed herein, may be implemented in a digital domain, and a corresponding processing speed may scale with process. One or more of method 100, DDWA DEM system 206, and DAC 300, may be implemented in one or more of circuit logic and a computer program product, also referred to herein as software, computer logic, and instructions, to cause a computer processor to perform one or more corresponding functions.

FIG. 4 is a block diagram of an exemplary implementation of system 200, wherein elements 214 through 216, and 218 through 220, are configured as switched-capacitor sampling circuits. Bank 208 elements 214 through 216 each include a capacitive element 402 and switches 404, 406, 408, and 410.

In bank 208, at time T1, switches 404 and 410, within each of elements 214 through 216, close and transfer charge from input node 212 to corresponding capacitors 402. At time T2, switches 404 and 410 open. At time T3, switches 406 close and transfer charge from corresponding capacitors 402 to capacitor Cfb 236. Also at time T3, switches 408 close to couple feedback lines 224 through 226, to corresponding capacitors 402. Feedback lines 224 through 226 may be coupled directly to capacitors 402, or may be applied to corresponding circuits 422, to generate corresponding feedback values to be provided to capacitors 402. An exemplary implementation of circuits 422 is disclosed below with reference to FIG. 6. At time T4, switches 406 and 408 open.

In bank 210, at time T3, switches 414 and 420, within each of elements 218 through 220, close and transfer charge from input node 212 to corresponding capacitors 412. At time T4, switches 414 and 420 open. At time T1, switches 416 close and transfer charge from corresponding capacitors 412 to capacitor Cfb 236. Also at time T1, switches 418, within elements 218 through 220, close to couple feedback lines 228 through 230 to corresponding capacitors 412 within elements 218 through 220. Feedback lines 228 through 230 may be coupled directly to capacitors 412, or may be applied to corresponding circuits 422 within elements 218 through 220, as described above with respect to bank 208. At time T2, switches 416 and 418 open.

Figure 6:
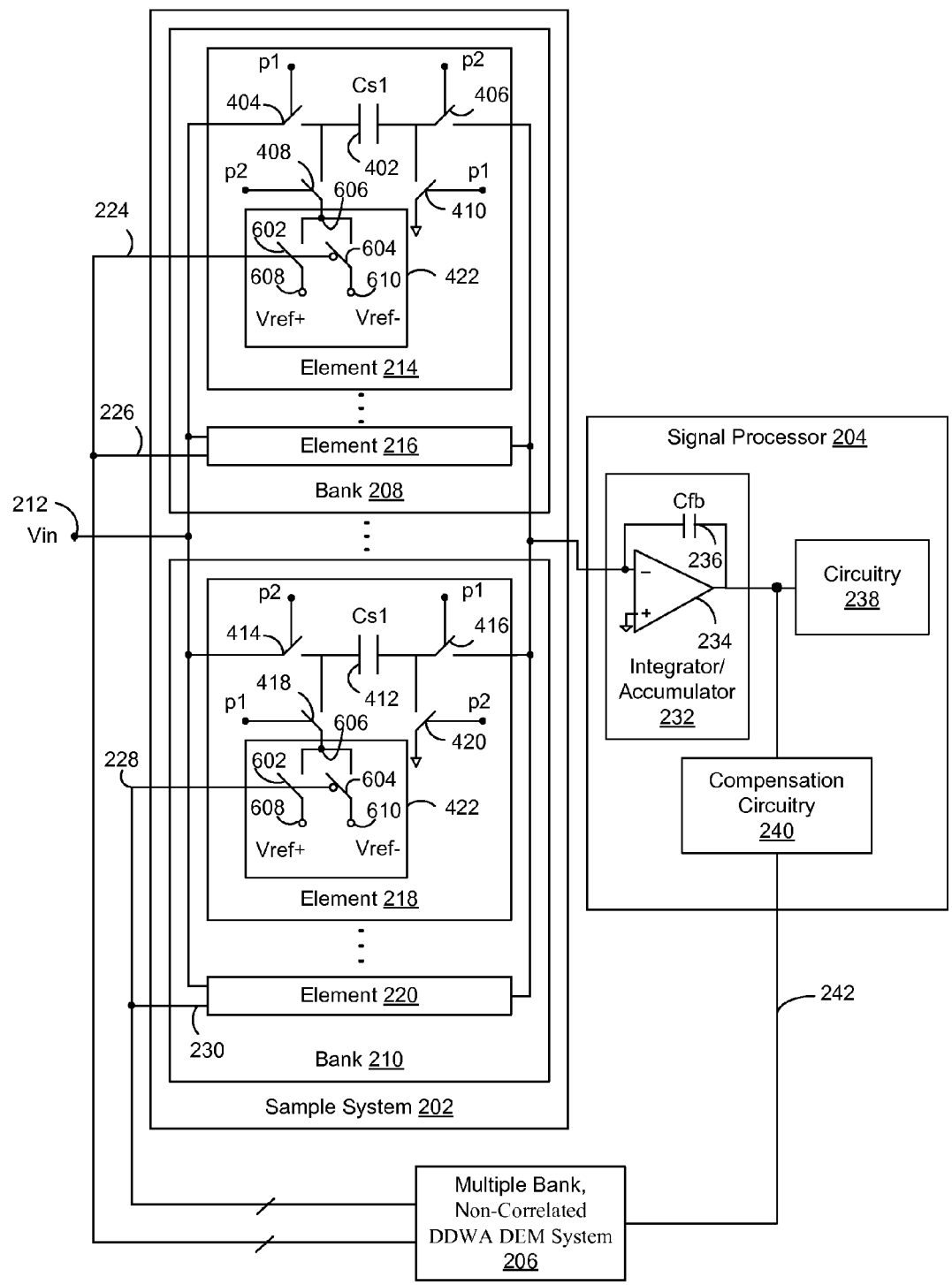
FIG. 6 is another exemplary block diagram of system 200.

FIG. 6 is another exemplary block diagram of system 200, wherein circuits 422 include first and second switches 602 and 604, having first terminals coupled to a terminal 606, and second terminals coupled to reference nodes 608 and 610, respectively, illustrated here as coupled to Vref+ and Vref−.

Operation of circuits 422 is described with reference to element 214. When feedback line 224 is high, switch 604 is open, switch 602 is closed, and Vref+ 608 is applied to terminal 606 through switch 602. When switch 408 is closed, Vref+ 608 is provided to capacitor Cfb 236 through capacitor 402.

Correspondingly, when feedback line 224 is low, switch 602 is open, switch 604 is closed, and Vref− 610 is applied to terminal 606. When switch 408 is closed, Vref− 610 is provided to capacitor Cfb 236 through capacitor 402.

Feedback lines 224 through 230 may be controlled to remove charge from capacitor Cfb 236, which was transferred to capacitor Cfb 236 during one or more previous sample cycles.

Methods and systems are disclosed herein with the aid of functional building blocks illustrating the functions, features, and relationships thereof. At least some of the boundaries of these functional building blocks may be arbitrarily defined herein for the convenience of the description. Alternate boundaries may be defined so long as the specified functions and relationships thereof are appropriately performed.

One skilled in the art will recognize that these functional building blocks can be implemented by discrete components, application specific integrated circuits, processors executing appropriate software, and combinations thereof.

While various embodiments are disclosed herein, it should be understood that they have been presented by way of example only, and not limitation.

What is claimed is:

1. A method, comprising:
   sampling an input signal with first and second banks of switched capacitor sample circuits during corresponding first and second sample phases;
   transferring sample charge from capacitors of the first and second bank sample circuits to an accumulator during corresponding first and second charge transfer phases;
   generating a digital feedback control signal to indicate of a number of the capacitors of the first and second banks to use to remove charge from the accumulator; and
   removing charge from the accumulator through the capacitors of the first and second bank sample circuits during the corresponding first and second charge transfer phases, including selecting capacitors of each of the first and second bank sample circuits, in accordance with the digital feedback control signal, to utilize each of the first bank capacitors a substantially equal number of times relative to one another over multiple sample cycles, and to utilize each of the second bank capacitors a substantially equal number of times relative to one another over the multiple sample cycles.

2. The method of claim 1, wherein the selecting of the first bank capacitors is performed without correlation to the selecting of the second bank capacitors.

3. The method of claim 1, wherein the selecting includes selecting the capacitors in accordance with a data weighted averaging technique.

4. The method of claim 3, wherein the selecting includes performing the data weighted averaging technique digitally.

5. The method of claim 3, wherein the selecting further includes maintaining first and second bank pointers as data weighted averages of indications of previously selected first and second bank capacitors, respectively, and, for each of the first and second banks:
   selecting a sequential number of the capacitors in accordance with the digital feedback control signal and the corresponding pointer; and
   incrementing the corresponding pointer by the selected number of capacitors.

6. The method of claim 5, wherein the selecting further includes, for each of the first and second banks:
   converting the digital feedback control signal to a thermometer code;
   shifting bits of the thermometer code in accordance with the corresponding pointer; and
   selecting the capacitors based on corresponding bits of the thermometer code.

7. The method of claim 6, wherein the removing of the charge includes, for each bank:
   coupling the corresponding capacitor to one of a first and second node based on a corresponding bit of the thermometer code.

8. The method of claim 1, wherein:
   the first sample phase coincides with the second charge transfer phase; and
   the second sample phase coincides with the first charge transfer phase.

9. The method of claim 1, wherein:
   the sampling of the input signal with the first bank of sample circuits, the transferring of charge from the second bank sample circuits to the accumulator, and the removing of charge from the accumulator through the selected second sample bank capacitors are performed substantially simultaneously; and
   the sampling of the input signal with the second bank of sample circuits, the transferring of charge from the first bank sample circuits to the accumulator, and the removing of charge from the accumulator through the selected first sample bank capacitors are performed substantially simultaneously.

10. A system, comprising:
    first and second banks of switched capacitor sample circuits to sample an input signal during corresponding first and second sample phases, to transfer sample charge from capacitors of the first and second sample circuits to an accumulator during corresponding first and second charge transfer phases, and to remove charge from the accumulator through the capacitors during the first and second charge transfer phases;
    a digital feedback control system to generate a digital feedback control signal indicative of a number of the capacitors to use to remove charge from the accumulator; and
    a selector to select capacitors of each of the first and second bank sample circuits to remove the charge, in accordance with the digital feedback control system, to utilize each of the first bank capacitors a substantially equal number of times relative to one another over multiple sample cycles, and to utilize each of the second bank capacitors a substantially equal number of times relative to one another over the multiple sample cycles.

11. The system of claim 10, wherein the selector is configured to select the first and second bank capacitors without correlation between the first and second banks.

12. The system of claim 10, wherein the selector is configured to select capacitors of each of the first and second bank sample circuits in accordance with a data weighted averaging technique.

13. The method of claim 12, wherein the selector is configured to perform the data weighted averaging digitally.

14. The system of claim 12, wherein the selector is further configured to maintain first and second bank pointers as data weighted averages of indications of previously selected first and second bank capacitors, respectively, and, for each of the first and second banks,
   to select a sequential number of the capacitors in accordance with the digital feedback control signal and the corresponding pointer; and
   to increment the corresponding pointer by the selected number of capacitors.

15. The system of claim 14, wherein the selector is further configured, for each of the first and second banks, to:
   convert the digital feedback control signal to a thermometer code;
   shift bits of the thermometer code in accordance with the corresponding pointer; and
   select the capacitors based on corresponding bits of the thermometer code.

16. The system of claim 15, wherein the switched capacitor sample circuits are each configured to:
   couple the corresponding capacitor to one of a first and second node based on a corresponding bit of the thermometer code.

17. The system of claim 10, wherein:
   the first sample phase coincides with the second charge transfer phase; and
   the second sample phase coincides with the first charge transfer phase.

18. The system of claim 10, wherein the first and second banks of switched capacitor sampling circuits are configured to:
   sample the input signal with the first bank of sample circuits, transfer charge from the second bank sample circuits to the accumulator, and remove charge from the accumulator through selected second sample bank capacitors substantially simultaneously; and
   sample the input signal with the second bank of sample circuits, transfer charge from the first bank sample circuits to the accumulator, and remove charge from the accumulator through selected first sample bank capacitors substantially simultaneously.

19. A system, comprising:
   a sigma-delta modulator analog-to-digital converter including a multiphase sampler,
   wherein the multiphase sampler includes,
      first and second banks of switched capacitor sample circuits to sample an input signal during corresponding first and second sample phases that are substantially 180 degrees out of phase with one another, to transfer sample charge from capacitors of the first and second sample circuits to an accumulator during corresponding first and second charge transfer phases, and to remove charge from the accumulator through the capacitors during the first and second charge transfer phases,
      a digital feedback control system to generate a digital feedback control signal indicative of a number of the capacitors to use to remove charge from the accumulator, and
      a selector to select capacitors of each of the first and second bank sample circuits to remove the charge, in accordance with the digital feedback control system, to utilize each of the first bank capacitors a substantially equal number of times relative to one another over multiple sample cycles, and to utilize each of the second bank capacitors a substantially equal number of times relative to one another over the multiple sample cycles.

20. The system of claim 19, wherein the selector is configured to maintain first and second bank pointers as data weighted averages of indications of previously selected first and second bank capacitors, respectively.

* * * * *

UNITED STATES PATENT AND TRADEMARK OFFICE
CERTIFICATE OF CORRECTION

PATENT NO. : 7,760,121 B2
APPLICATION NO. : 12/203679
DATED : July 20, 2010
INVENTOR(S) : Hasnain Lakdawala et al.

It is certified that error appears in the above-identified patent and that said Letters Patent is hereby corrected as shown below:

On face page, in field 56, in column 2, under "OTHER PUBLICATIONS", line 2, delete "ASC" and insert -- ADC --, therefor.

On face page, in field 56, in column 2, under "OTHER PUBLICATIONS", line 11, delete "Receiver"," and insert -- Receivers", --, therefor.

Signed and Sealed this

Twenty-eighth Day of September, 2010

David J. Kappos
*Director of the United States Patent and Trademark Office*